United States Patent
Aleksov et al.

(10) Patent No.: US 10,353,146 B2
(45) Date of Patent: Jul. 16, 2019

(54) FLEXIBLE AND STRETCHABLE OPTICAL INTERCONNECT IN WEARABLE SYSTEMS

(71) Applicant: Intel Corporation, Santa Clara, CA (US)

(72) Inventors: Aleksandar Aleksov, Chandler, AZ (US); Michael C. Rifani, Beaverton, OR (US); Sasha N. Oster, Chandler, AZ (US); Adel A. Elsherbini, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/635,881

(22) Filed: Jun. 28, 2017

(65) Prior Publication Data
US 2019/0003882 A1    Jan. 3, 2019

(51) Int. Cl.
| | |
|---|---|
| *G02B 6/12* | (2006.01) |
| *G02B 6/122* | (2006.01) |
| *G02B 6/42* | (2006.01) |
| *H05K 1/02* | (2006.01) |
| *H04B 10/80* | (2013.01) |

(52) U.S. Cl.
CPC ......... *G02B 6/1221* (2013.01); *G02B 6/4253* (2013.01); *H05K 1/0274* (2013.01); *H04B 10/801* (2013.01)

(58) Field of Classification Search
None
See application file for complete search history.

(56) References Cited

U.S. PATENT DOCUMENTS

| | | | | |
|---|---|---|---|---|
| 4,762,381 A | * | 8/1988 | Uemiya | B29C 47/0016 385/123 |
| 5,325,453 A | * | 6/1994 | Drissler | G02B 6/2808 385/24 |
| 5,367,597 A | * | 11/1994 | Palmskog | G02B 1/048 385/129 |
| 7,809,228 B2 | * | 10/2010 | Ohtsu | G02B 6/43 385/101 |

(Continued)

FOREIGN PATENT DOCUMENTS

WO    WO 2017/015563 A1 *    1/2017

OTHER PUBLICATIONS

Cai, Ziliang, et al., "A new fabrication method for all-PDMS waveguides", Sensors and Actuators A 204 (2013) 44-47, (2013), 4 pgs.

(Continued)

*Primary Examiner* — Michael Stahl
(74) *Attorney, Agent, or Firm* — Schwegman Lundberg & Woessner, P.A.

(57) ABSTRACT

Various embodiments disclosed relate to a stretchable packaging system. The system includes a first electronic component. The first electronic component includes a first optical emitter. The system further includes a second electronic component. The second electronic component includes a first receiver. An optical interconnect including a first elastomer having a first refractive index connects the first optical emitter to the first receiver. An encapsulate layer including a second elastomer having a second refractive index at least partially encapsulates the first electronic component, the second electronic component, and the optical interconnect.

19 Claims, 7 Drawing Sheets

(56) References Cited

U.S. PATENT DOCUMENTS

| | | | | |
|---|---|---|---|---|
| 9,034,222 B2* | 5/2015 | Koos | ............... | G02B 6/305 |
| | | | | 264/1.24 |
| 9,869,807 B2* | 1/2018 | Kim | ............... | G02B 6/0041 |
| 2007/0133935 A1* | 6/2007 | Fine | ............... | B82Y 5/00 |
| | | | | 385/131 |
| 2008/0193094 A1* | 8/2008 | Enami | ............... | G02B 6/10 |
| | | | | 385/130 |
| 2009/0202713 A1* | 8/2009 | Pitwon | ............... | G02B 6/1221 |
| | | | | 427/163.2 |
| 2009/0310905 A1* | 12/2009 | Riester | ............... | G02B 6/138 |
| | | | | 385/14 |
| 2011/0135248 A1* | 6/2011 | Langer | ............... | G02B 6/138 |
| | | | | 385/14 |
| 2013/0062799 A1* | 3/2013 | Jeong | ............... | G02B 6/1221 |
| | | | | 264/1.24 |
| 2013/0214439 A1* | 8/2013 | McLeod | ............... | G03F 7/70416 |
| | | | | 264/1.27 |
| 2016/0072585 A1* | 3/2016 | Halderman | ............... | G02B 6/4204 |
| | | | | 398/141 |
| 2018/0188125 A1* | 7/2018 | Park | ............... | G01L 1/24 |

OTHER PUBLICATIONS

Kopetz, Stefan, et al., "PDMS-based optical waveguide layer for integration in electrical-optical circuit boards", Int. J. Electron. Commun. (AEÜ) 61 (2007) 163-167, (2007), 5 pgs.

* cited by examiner

FLEXIBLE AND STRETCHABLE OPTICAL INTERCONNECT IN WEARABLE SYSTEMS

BACKGROUND

Wearable electronic systems typically include at least two electronic components in communication with each other through an interconnection element. Typically, the system is encapsulated in a material. The encapsulating material may be chosen from a variety of materials. Factors that may drive the selection of a particular material include whether the material is comfortable when contacting a user. Various other factors include whether the material appears to be stylish to the user and whether the material is durable.

BRIEF DESCRIPTION OF THE FIGURES

In the drawings, which are not necessarily drawn to scale, like numerals describe substantially similar components throughout the several views. The drawings illustrate generally, by way of example, but not by way of limitation, various embodiments discussed in the present document.

DETAILED DESCRIPTION

Reference will now be made in detail to certain embodiments of the disclosed subject matter, examples of which are illustrated in part in the accompanying drawings. While the disclosed subject matter will be described in conjunction with the enumerated claims, it will be understood that the exemplified subject matter is not intended to limit the claims to the disclosed subject matter.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts may be carried out in any order without departing from the principles of the inventive subject matter, except when a temporal or operational sequence is explicitly recited. Furthermore, specified acts may be carried out concurrently unless explicit claim language recites that they be carried out separately. For example, a claimed act of doing X and a claimed act of doing Y may be conducted simultaneously within a single operation, and the resulting process will fall within the literal scope of the claimed process.

The term "about" as used herein may allow for a degree of variability in a value or range, for example, within 10%, within 5%, or within 1% of a stated value or of a stated limit of a range, and includes the exact stated value or range.

The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%.

Figure 1:
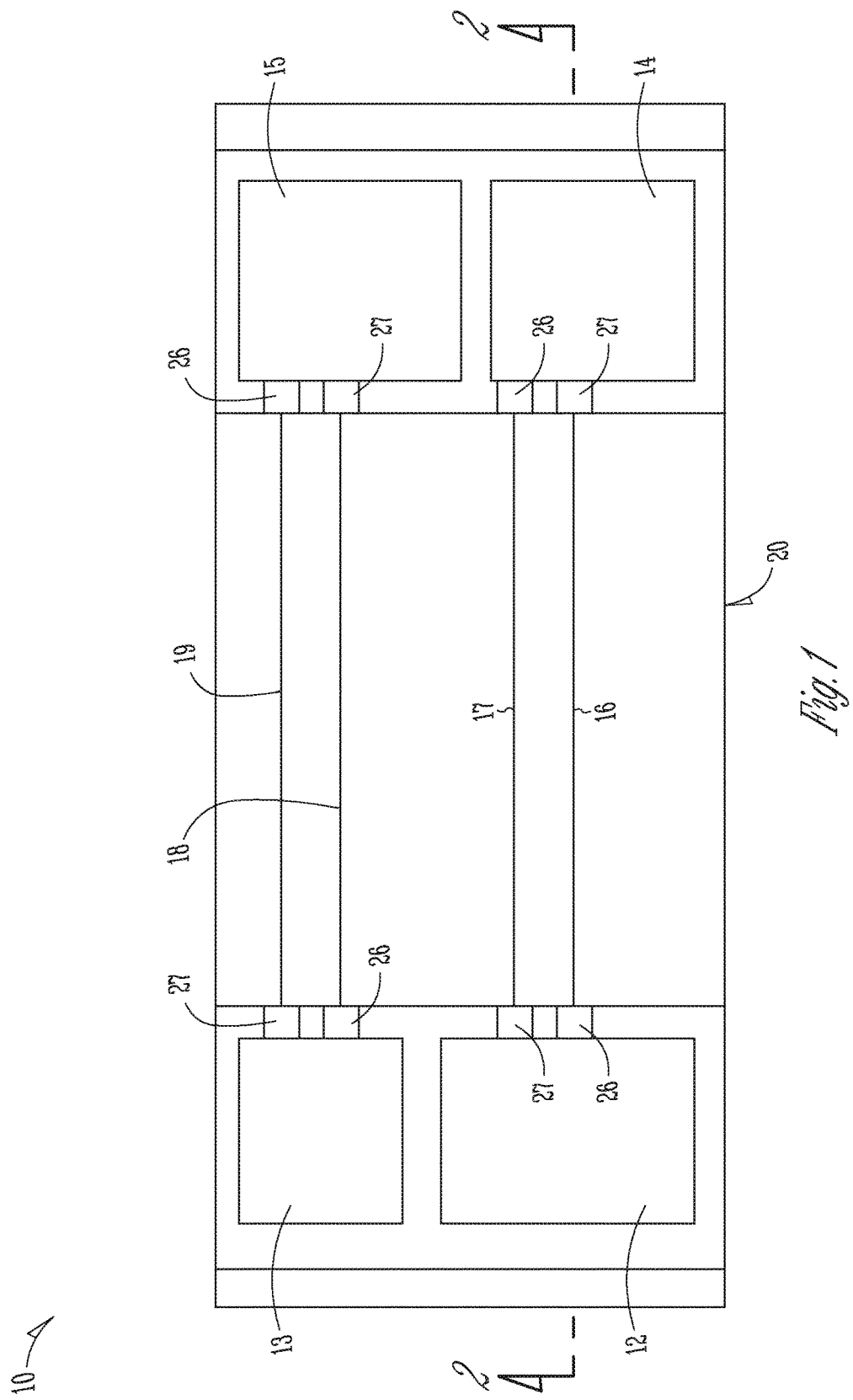
FIG. 1 is a top schematic view illustrating a stretchable packaging system, in accordance with various embodiments.
Figure 2:
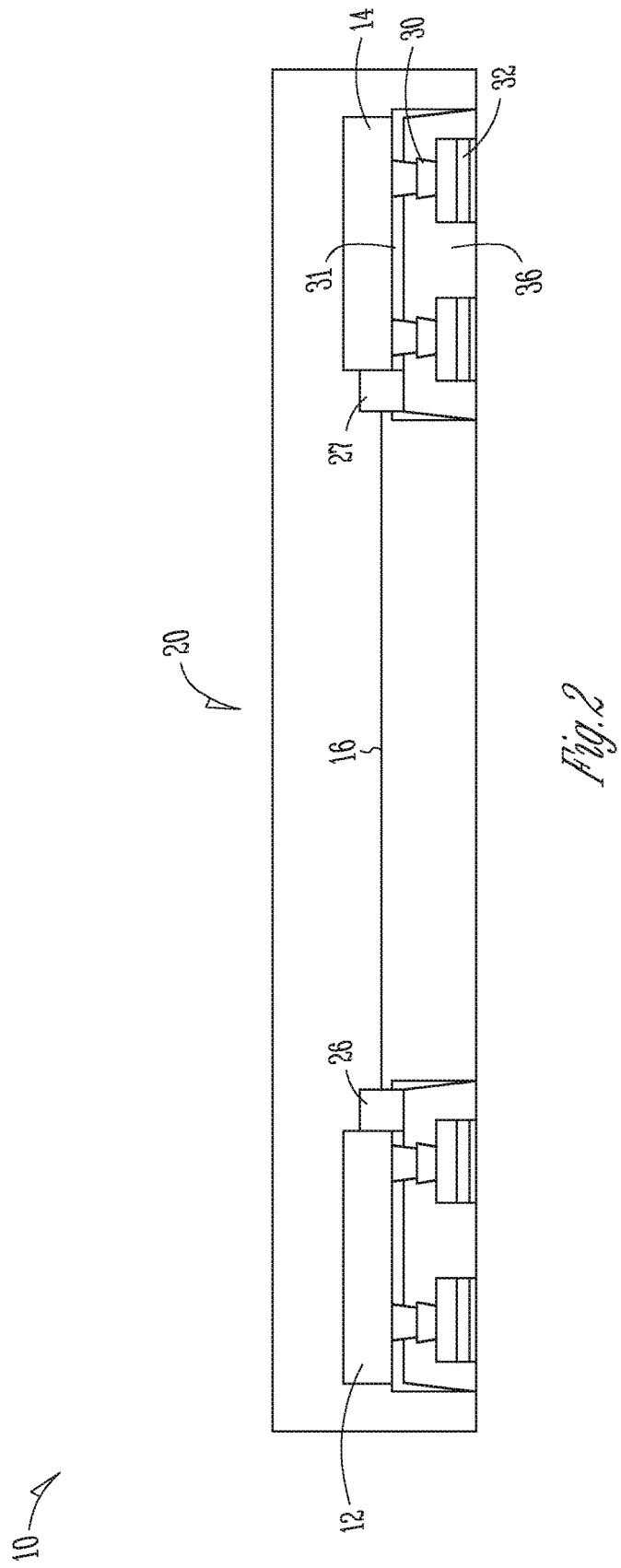
FIG. 2 is a schematic sectional view of the stretchable packaging system taken along line A-A of FIG. 1, in accordance with various embodiments.

FIGS. 1 and 2 illustrate many of the same components and will be discussed concurrently. FIG. 1 is a top schematic view illustrating a stretchable packaging system that may be used, for example, in a machine or wearable electronic device. As illustrated, stretchable packaging system 10 includes first electronic component 12, second electronic component 13, third electronic component 14, fourth electronic component 15, first optical interconnect 16, second optical interconnect 17, third optical interconnect 18, fourth optical interconnect 19, and encapsulant layer 20. Although four electronic components and four optical interconnects are shown in FIG. 1, it is within the scope of this disclosure to include fewer or more electronic components or optical interconnects in stretchable packaging system 10.

FIG. 2 is a schematic sectional view of stretchable packaging system 10 taken along line A-A' of FIG. 1. FIG. 2 illustrates many of the same components as FIG. 1 and additionally illustrates solder interconnect 30, pad 32, epoxy underfill layer 31, and dielectric layer 36.

First, second, third, and fourth electronic components 12, 13, 14, and 15 are in contact with solder interconnects 30. Solder interconnects 30 are coupled to pads 32, which are ultimately coupled to electronic components 12, 13, 14, and 15. Electronic components 12, 13, 14, and 15 receive input and output signals through optical interconnects 16, 17, 18, and 19. First, second, third, and fourth electronic components 12, 13, 14, and 15 may be many types of components. For example, first and second electronic components 12 and 13 may be dies. The dies may be any suitable die including a memory die or central processing unit die. While the disclosure herein may refer to first, second, third, and fourth electronic components 12, 13, 14, and 15 as dies, it is to be recognized and understood that the dies may be substituted for, or included with, microelectronic components generally, and that the various microelectronic components may be implemented according to the same or essentially the same principles disclosed herein. The microelectronic components may be or include, in addition or in alternative to the dies, discrete microelectronic components, such as capacitors, resistors, transistors, and the like, and/or may be or include a prepackaged die, chip assembly, or system in a package.

As shown in FIGS. 1 and 2, each of electronic components 12, 13, 14, and 15 includes optical transmitter 26 and optical receiver 27. While not so limited, examples of suitable optical transmitters 26 may include a light-emitting diode (LED) or a laser diode (LD). The LED or LD may be configured to emit light having a predetermined wavelength. In some examples, the LED or LD may be fit with a modulator to selectively change the wavelength of the emitted light. Optical receivers 27 may be any suitable component for receiving a signal from optical transmitters 26. While not so limited, optical receivers 27 may be photodiode receivers.

As shown in FIGS. 1 and 2, each optical interconnect 16, 17, 18, and 19 is connected to a respective optical transmitter 26 and optical receiver 27 in order to connect electronic components 12, 13, 14, and 15. Once electronic components 12, 13, 14, and 15 are connected, optical signals for transferring information or even electrical power may be transmitted between or among electronic components 12, 13, 14, and 15.

Optical interconnects 16, 17, 18, and 19 include one or more classes of elastomers and are free of a metal. Electronic components 12, 13, 14, and 15 as well as optical interconnects 16, 17, 18, and 19 are at least partially encapsulated by encapsulant layer 20. Encapsulant layer 20 comprises one or more classes of elastomers. Suitable examples of elastomer classes that may be included in optical interconnects 16, 17, 18, and 19 as well as encapsulant layer 20 include thermoplastic polyurethane, butyl rubber, poly-dimethyl siloxane, and latex. Additional elastomers may include polyisoprene, polybutadiene, chloroprene, styrene-butadiene, nitrile rubber, ethylene propylene rubber, ethylene propylene diene rubber, epichlorohydrin, polyacrylic rubber, silicone rubber, fluorosilicone rubber, fluoroelastomer, perfluoroelastomer, polyether block amide, chlorosulfonated polyethylene, ethylene-vinyl acetate, and polysuflides. The choice of the elastomer may be driven by considerations such as the refractive index, flexibility, or durability of the elastomer. The choice of elastomer may additionally be driven by whether the elastomer forms a layer that is waterproof or at least water resistant.

Optical interconnects 16, 17, 18, and 19 and encapsulant layer 20 may include the same class of elastomer; however, a refractive index value of the one or more elastomers of any one of optical interconnects 16, 17, 18, and 19 will be different from the refractive index value of the one or more elastomers of encapsulant layer 20. With respect to each other, optical interconnects 16, 17, 18, and 19 may include at least one elastomer of the same or a different class, having the same or a different refractive index value. Refractive index values of any elastomer may be in a range of about 1.00 to about 2.00, about 1.25 to about 1.75, or less than, equal to, or greater than about 1.00, 1.1, 1.2, 1.3, 1.4, 1.5, 1.6, 1.7, 1.8, 1.9, or 2.00.

The different indices of refraction between optical interconnects 16, 17, 18, and 19 and encapsulant layer 20 function to guide the optical signal between optical transmitters 26 and optical receivers 27. In this manner, each of optical interconnects 16, 17, 18, and 19 acts as an optical waveguide to guide the optical signal between respective optical transmitter 26 and optical receiver 27. While FIGS. 1 and 2 show individual optical interconnects 16, 17, 18, and 19 connected to only one optical transmitter 26 and only one optical receiver 27, it is possible for individual optical transmitters 26 and optical receivers 27 to be connected to multiple optical interconnects. Furthermore, although optical interconnects 16, 17, 18, and 19 are shown as extending straight between optical transmitters 26 and optical receivers 27, in other examples, optical interconnects may be curved or have any other profile between optical transmitters 26 and optical receivers 27.

Stretchable packaging system 10 may be worn by a user. In order to be wearable, stretchable packaging system 10 may have many different shapes. For example, stretchable packaging system 10 may have a band-like shape such as that of a watchband. Additionally, stretchable packaging system 10 may be shaped like a patch that may be directly worn (e.g., as a medical patch). A patch shape may also help stretchable packaging system 10 to be incorporated into a textile. The textile in turn may be incorporated into an article of clothing. As non-limiting examples, the textile or stretchable packaging system 10 alone may be incorporated in a seam of a garment.

Stretchable packaging system 10 may also be incorporated into a machine. According to some examples, the machine may include multiple components that may need to communicate with each other and are subjected to relative flexing, stretching, twisting, or the like during operation. Non-limiting examples of suitable machines include aerospace or automotive machines. For example, any of electronic components 12, 13, 14, or 15 of stretchable packaging system 10 may be sensors, or components thereof, that are connected to different components or locations of a gas turbine engine or aircraft wing.

Whether attached to a user or a machine, stretchable packaging system 10 may be subjected to forces and stresses caused by movement of the wearer or machine components. These stresses may cause stretchable packaging system 10 to be stretched. In order to maintain functionality, it may be important for optical interconnects 16, 17, 18, or 19 to be able to stretch without breaking and thereby severing the connection between or among any of electronic components 12, 13, 14, and 15. Optical interconnects 16, 17, 18, or 19 accordingly are designed to stretch in response to these forces, and may therefore absorb these stresses. This is because optical interconnects 16, 17, 18, and 19 include an elastomer, which allows optical interconnects 16, 17, 18, and 19 to stretch to lengths many times greater than a relaxed length of stretchable packaging system 10. "Relaxed length" is meant to refer to the length of stretchable packaging system 10 at rest (e.g., with no forces applied to stretch optical interconnects 16, 17, 18, and 19). Optical interconnects 16, 17, 18, and 19 may stretch, for example, from about 1.01 times to about 1000 times the relaxed length, from about 2 times to about 100 times, or less than, equal to, or greater than about 1.01 times, 5, 10, 15, 20, 25, 30, 35, 40, 45, 50, 55, 60, 65, 70, 75, 80, 85, 90, 95, 100, 105, 110, 115, 120, 125, 130, 135, 140, 145, 150, 155, 160, 165, 170, 175, 180, 185, 190, 195, 200, 205, 210, 215, 220, 225, 230, 235, 240, 245, 250, 255, 260, 265, 270, 275, 280, 285, 290, 295, 300, 305, 310, 315, 320, 325, 330, 335, 340, 345, 350, 355, 360, 365, 370, 375, 380, 385, 390, 395, 400, 405, 410, 415, 420, 425, 430, 435, 440, 445, 450, 455, 460, 465, 470, 475, 480, 485, 490, 495, 500, 505, 510, 515, 520, 525, 530, 535, 540, 545, 550, 555, 560, 565, 570, 575, 580, 585, 590, 595, 600, 605, 610, 615, 620, 625, 630, 635, 640, 645, 650, 655, 660, 665, 670, 675, 680, 685, 690, 695, 700, 705, 710, 715, 720, 725, 730, 735, 740, 745, 750, 755, 760, 765, 770, 775, 780, 785, 790, 795, 800, 805, 810, 815, 820, 825, 830, 835, 840, 845, 850, 855, 860, 865, 870, 875, 880, 885, 890, 895, 900, 905, 910, 915, 920, 925, 930, 935, 940, 945, 950, 955, 960, 965, 970, 975, 980, 985, 990, 995, or about 1000 times. While optical interconnects 16, 17, 18, and 19 are able to stretch in response to the forces, it is also within the scope of this disclosure to allow optical interconnects 16, 17, 18, and 19 to rotate independently or in conjunction with stretching. In this manner, optical interconnects 16, 17, 18, and 19 are able to move with many degrees of freedom. Encapsulant layer 20 is adapted to stretch or rotate in a corresponding manner to optical interconnects 16, 17, 18, and 19.

While optical interconnects 16, 17, 18, and 19 and encapsulant layer 20 are configured to stretch or rotate, other components of stretchable packaging system 10 may be damaged if subjected to stretching or rotation. For example, electronic components 12, 13, 14, or 15 are better suited to remain rigid in response to these forces. Encapsulant layer 20 is accordingly configured to better accommodate the ability of optical interconnects 16, 17, 18, and 19 to stretch while keeping electronic components 12, 13, 14, and 15 relatively stiff or rigid in response to these stresses.

Figure 3:
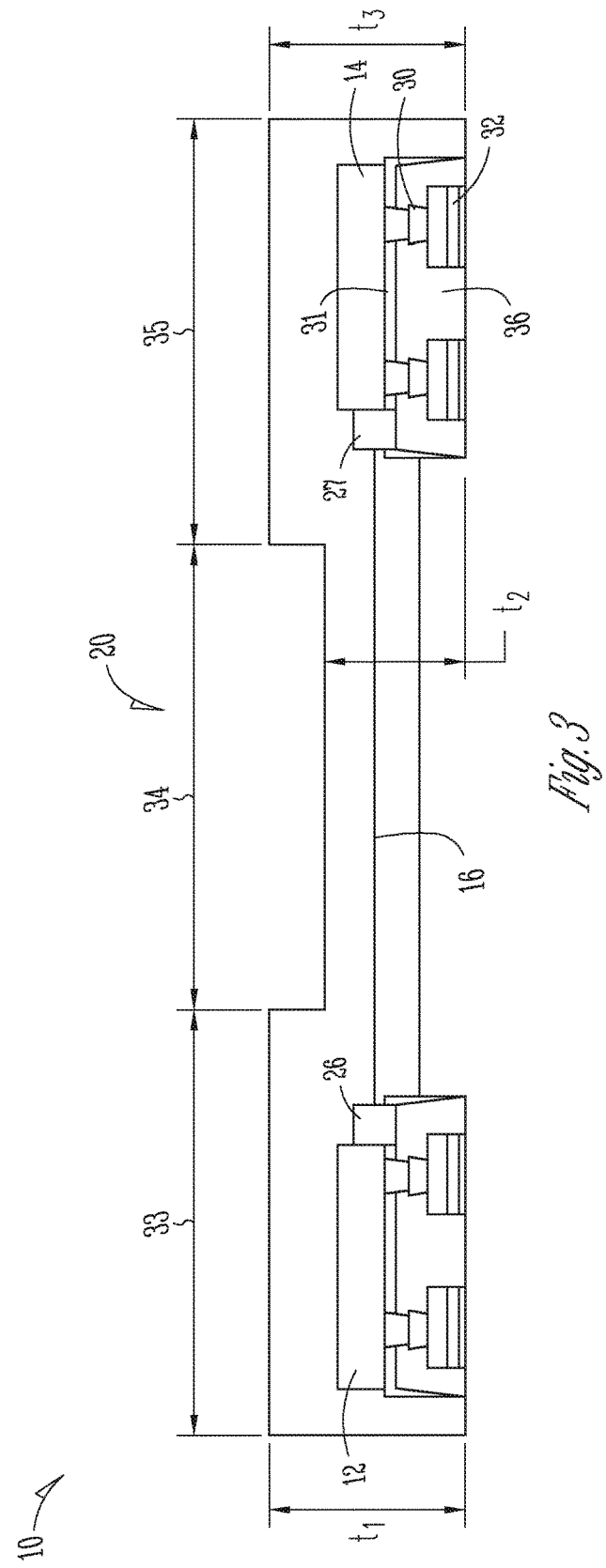
FIG. 3 is a schematic view of the stretchable packaging system in which the encapsulant layer has a variable thickness, in accordance with various embodiments.

FIG. 3 shows an example of stretchable packaging system 10 in which encapsulant layer 20 has a variable thickness. To allow stretchable packaging system 10 to better accommodate the dispersion of these stresses between components that are to remain relatively rigid and those that may be flexible, encapsulant layer 20 has a variable thickness as defined by first region 33, second region 34, and third region 35. First region 33 at least partially encapsulates first electronic component 12 and second electronic component 13. First region 33 has a first thickness $t_1$ that is greater than a second thickness $t_2$ of second region 34. Second region 34 at least partially encapsulates optical interconnects 16, 17, 18, and 19. Third region 35 at least partially encapsulates third electronic component 14 and fourth electronic component 15. Third region 35 has a third thickness $t_3$ that is greater than the second thickness $t_2$.

The variable thickness of encapsulant layer 20 results in some of regions 33, 34, and 35 being stiffer or more flexible than others. Whether a region is stiffer or more flexible depends on the thickness of the region. For example, first region 33 at least partially encapsulates first electronic component 12, which is configured to be stiff or rigid relative to optical interconnects 16, 17, 18, and 19. Accordingly, first region 33 should be stiffer than second region 34. To achieve this, the first thickness $t_1$ may range from about 1.5 to about 10 times greater than the second thickness $t_2$. Similarly, third region 35 at least partially encapsulates third electronic component 14. Third electronic component 14 is also configured to be stiff or rigid relative to optical interconnects 16, 17, 18, and 19. Therefore, the third thickness $t_3$ may range from about 1.5 to about 10 times greater than the second thickness $t_2$. In some examples, the first thickness $t_1$ and the third thickness $t_3$ may be substantially equivalent. In other examples, the first thickness $t_1$ and the third thickness $t_3$ may differ from each other. For example, the third thickness $t_3$ may be less than the first thickness $t_1$. However, neither the first thickness $t_1$ nor the third thickness $t_3$ will be less than the second thickness $t_2$.

Additionally, in some examples, the thickness within each region may vary. For example, first region 33 may have a maximum thickness and a minimum thickness; the minimum thickness, however, will be greater than the second thickness $t_2$ of second region 34. Similarly, second region 34 may have a maximum thickness and a minimum thickness; however, the maximum thickness will not be greater than a minimum thickness of first or third regions 33 and 35.

Figure 4A:
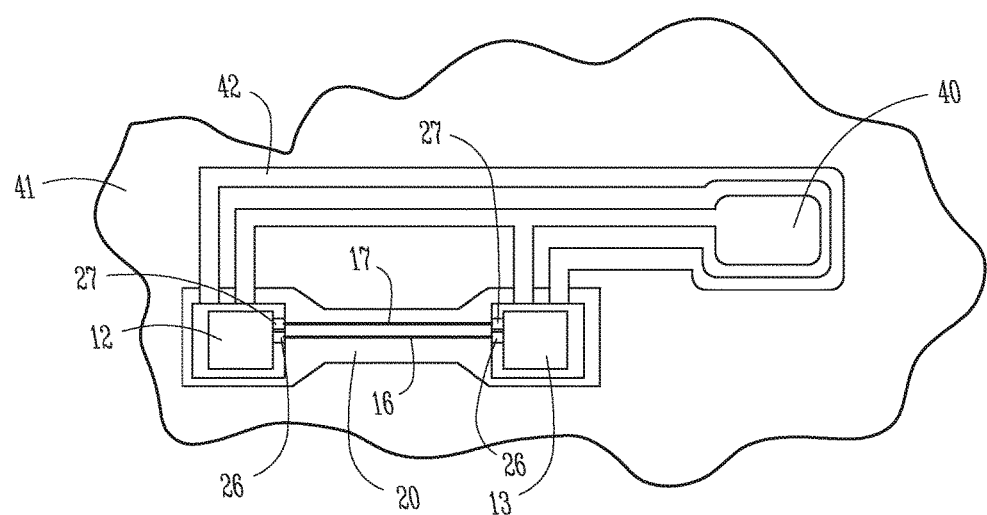
FIG. 4A is a schematic view of the stretchable packaging system incorporated in a textile with a showing a first powering scheme, in accordance with various embodiments.
Figure 4B:
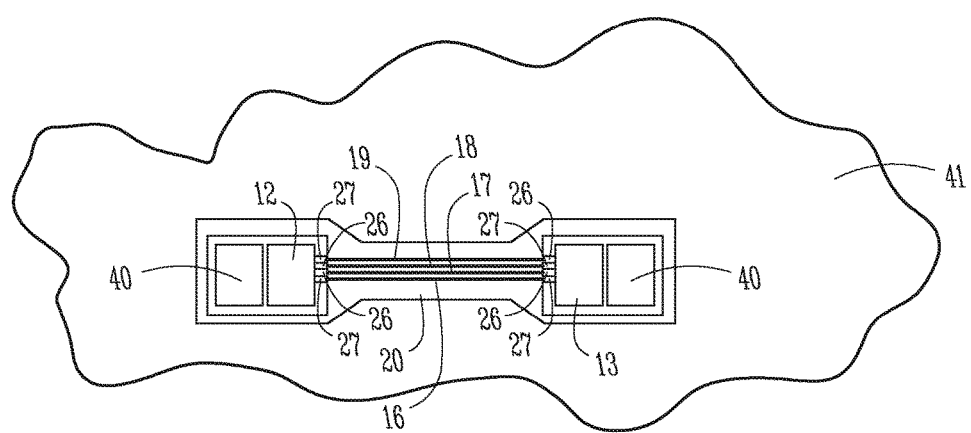
FIG. 4B is a schematic view of the stretchable packaging system incorporated in a textile with a showing a second powering scheme, in accordance with various embodiments.
Figure 4C:
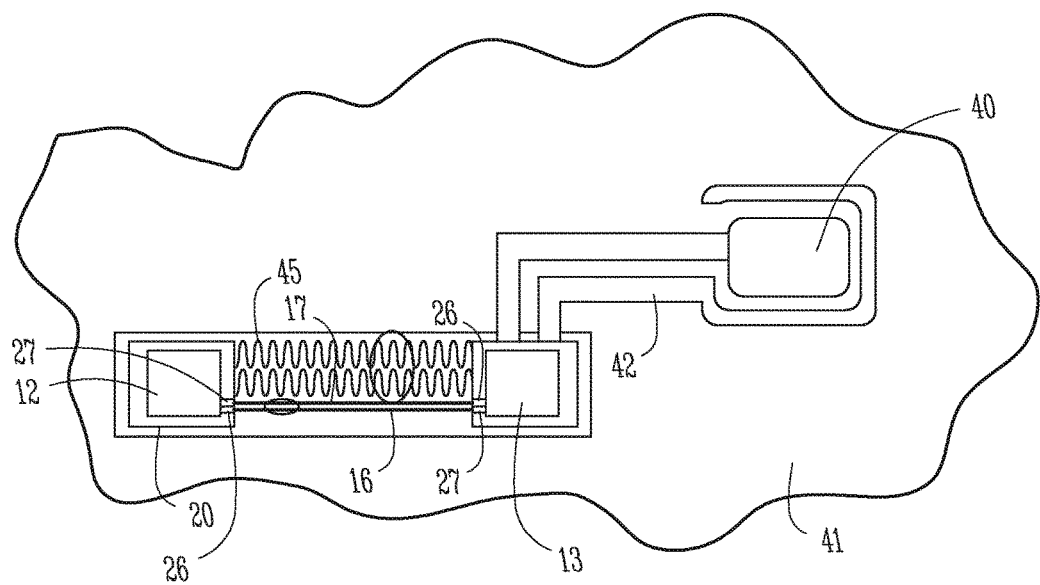
FIG. 4C is a schematic view of the stretchable packaging system incorporated in a textile with a showing a third powering scheme, in accordance with various embodiments.

Any of first electronic component 12, second electronic component 13, third electronic component 14, or fourth electronic component 15 may be powered in any suitable way. For example, as shown in FIG. 4, each of electronic components 12, 13, may be directly connected to external power source 40 that is not encapsulated by encapsulant layer 20. An example of a suitable power source 40 may include a battery. As shown in FIG. 4, system 10 is placed on textile 41, which may be located at a seam of a garment. Electronic components 12 and 13 are individually connected to power source 41 by flexible interconnects 42. Alternatively, as shown in FIG. 4B, in some examples, a power source 40 may be directly joined to electronic components 12 and 13 and encapsulated in encapsulant layer 20. In some examples, less than all of electronic components 12 or 13 may be directly joined to power source 40. To provide power to those components not directly joined to 40 power source, meandering metallic trace 45 may be used to connect components and provide either power or a ground to the components, as shown in FIG. 4C. In some examples, the meandering trace may include a conductive metal such as copper and be encapsulated by encapsulant layer 20.

Figure 5:
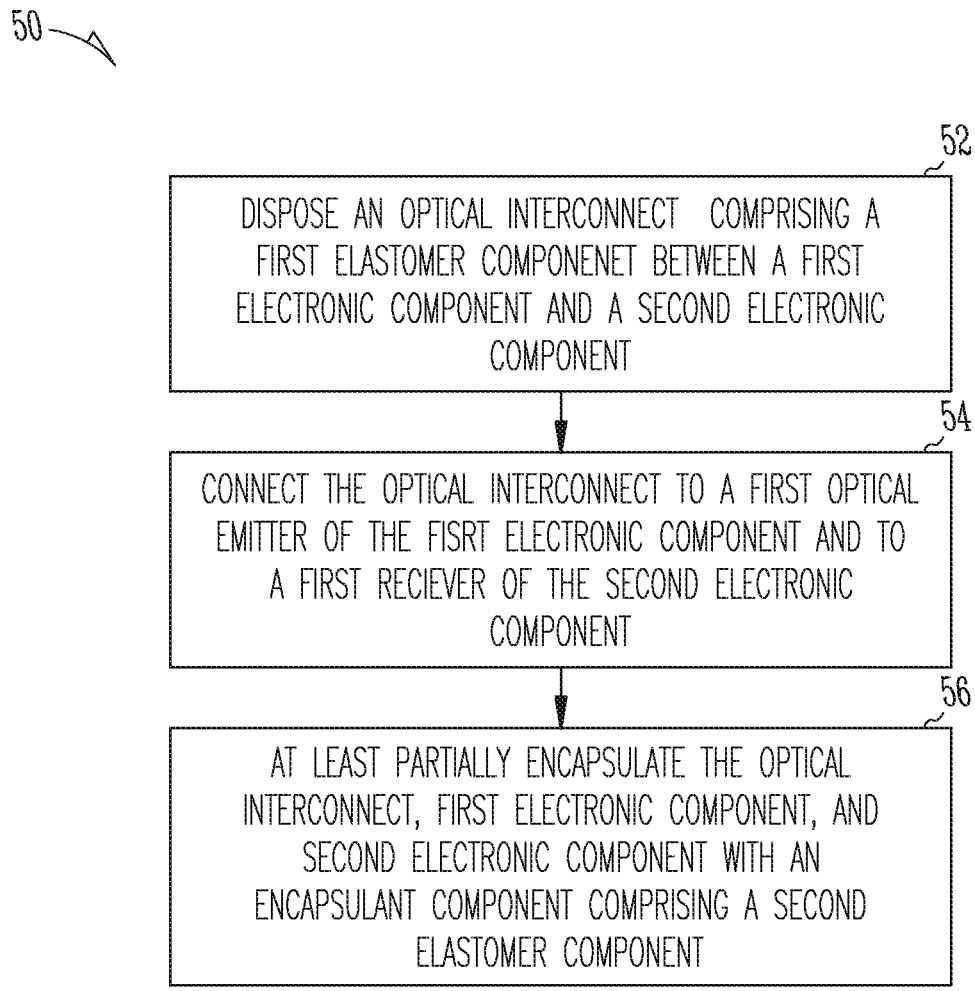
FIG. 5 is a flow chart generally illustrating a method of forming the stretchable packaging system, in accordance with various embodiments.

There are many ways to form stretchable packaging system 10. FIG. 5 is a flow chart generally illustrating method 50 of forming stretchable packaging system 10. As shown in FIG. 5, method 50 includes operation 52. In operation 52, first optical interconnect 16 is disposed between electronic components. For example, first optical interconnect 16 may be disposed between first electronic component 12 and third electronic component 14. In operation 54, first optical interconnect 16 is connected to optical transmitter 26 of first electronic component 12 and to optical receiver 27 of third electronic component 14. First optical interconnect 16 may be connected to optical transmitter 26 and optical receiver 27 by heating first optical interconnect 16 above a solidification temperature e.g., glass transition temperature, melting point, crystallization temperature, or gelation temperature) of the elastomer(s) of first optical interconnect 16. In operation 56, first optical interconnect 16, first electronic component 12, and third electronic component 14 are at least partially encapsulated with a second elastomer component.

First optical interconnect 16 may be disposed according to operation 52 in many suitable ways. For example, a first elastomer chosen from those mentioned herein may be disposed between first electronic component 12 and third electronic component 14. Alternatively, the first elastomer component may be disposed along a length equivalent to the length between first electronic component 12 and third electronic component 14. The first elastomer may then be irradiated to alter the index of refraction of the first elastomer. The first elastomer may be irradiated, for example, with an ultraviolet radiation source.

Alternatively, a layer of the first elastomer may be disposed between first electronic component 12 and third electronic component 14, or an equivalent length. A mask may then be placed over the layer in order to selectively expose only a certain region(s) of the first elastomer layer. A laser may then be used to remove the exposed regions of the first elastomer layer.

In other examples, a layer of the first elastomer may be disposed between first electronic component 12 and third electronic component 14, or an equivalent length. The layer may then be embossed in order to selectively raise a certain region(s) of the first elastomer layer.

In other examples, a layer of the first elastomer may be disposed between first electronic component 12 and third electronic component 14, or an equivalent length, through an additive manufacturing process.

Following disposition, the first elastomer may then be encapsulated by the second elastomer component. If the first elastomer is not already disposed between first electronic component 12 and third electronic component 14, then the encapsulated first elastomer is placed between electronic components 12 and 14. The ends of the first elastomer are connected to a respective optical transmitter 26 and optical receiver 27 to form first optical interconnect 16. If needed, an additional quantity of the second elastomer may be further disposed over electronic components 12, 13, 14, and 15.

Figure 6:
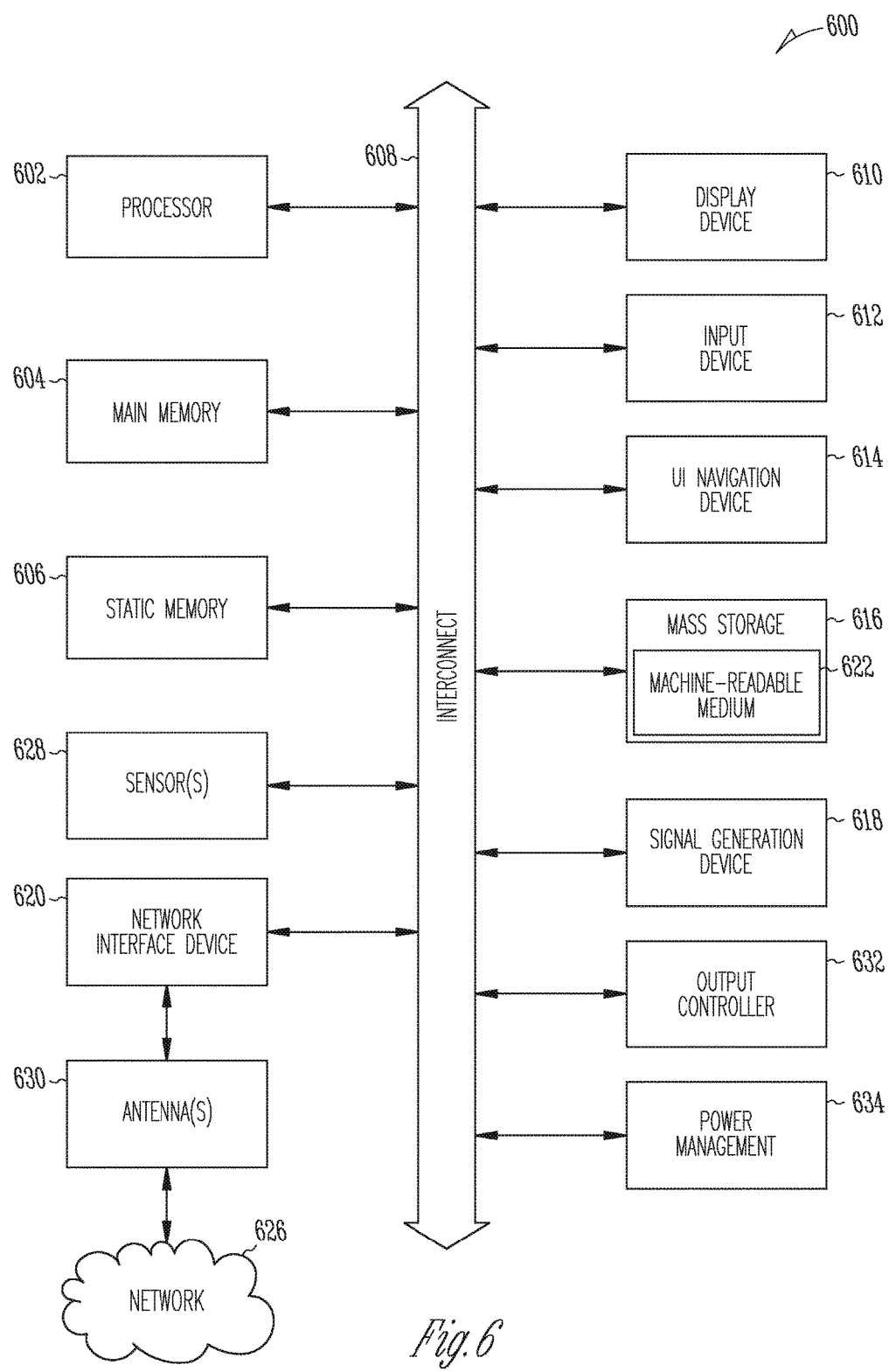
FIG. 6 is a block diagram of an electronic system including the stretchable packaging system, according to various embodiments.

FIG. 6 illustrates a system-level diagram, according to an embodiment of the disclosure. For instance, FIG. 6 depicts an example of an electronic device (e.g., system) including stretchable packaging system 10, which includes electronic components 12, 13, 14, and 15, and optical interconnects 16, 17, 18, and 19. FIG. 6 is included to show an example of a higher-level device application for the present disclosure. FIG. 6 is a block diagram illustrating an example computer system 600 machine which can include or be implemented at least partially on a device as discussed herein. Computer system 600 can be a computing device. In an example, the machine can operate as a standalone device or can be connected (e.g., via a cellular network) to other machines. In a networked deployment, the machine can operate in the capacity of either a server or a client machine in server-client network environments, or it can act as a peer machine in peer-to-peer (or distributed) network environments. Further, while only a single machine is illustrated, the term "machine" shall also be taken to include any collection of machines that individually or jointly execute a set (or multiple sets) of instructions to perform any one or more of the methodologies discussed herein.

Example computer system 600 can include a processor 602 (e.g., a Central Processing Unit (CPU), a Graphics Processing Unit (GPU) or both), a main memory 604 and a static memory 606, which communicate with each other via an interconnect 608 (e.g., a link, a bus, etc.). The computer system 600 can further include a video display unit 610, an alphanumeric input device 612 (e.g., a keyboard), and a User Interface (UI) navigation device 614 (e.g., a mouse). In an example, the video display unit 610, input device 612 and UI navigation device 614 are a touch screen display. The computer system 600 can additionally include a storage device 616 (e.g., a drive unit), a signal generation device 618 (e.g., a speaker), an output controller 632, a power management controller 634, and a network interface device 620 (which can include or operably communicate with one or more antennas 630, transceivers, or other wireless communications hardware), and one or more sensors 628, such as a GPS sensor, compass, location sensor, accelerometer, or other sensor. The antennas 630 can be coupled to a network 626. Any of the items of the system 600 can include a substrate that was built on a panel discussed herein.

There are many reasons to use stretchable packaging system 10, according to the present disclosure. An example of a non-limiting reason is the ability of stretchable packaging system 10 to remain intact and show substantially better durability than a corresponding packaging system that is free of an optical interconnect or including a meandering metallic trace.

Additionally, according to some examples, optical interconnects including at least some of the elastomers of the present disclosure may experience losses as low as 0.06 dB/cm at 850 nm. These losses are low enough for communications over a short distance of a few inches to several feet.

Additionally, according to some examples, the inclusion of optical interconnects may facilitate easier "plug-and-play" or modularity of an electronic component than a system that includes a meandering metallic trace interconnect. The increased modularity afforded by the optical interconnects may easily allow for interchangeability and easy upgrading in a modular fashion. This may lower the technical barrier associated with the modular operations in systems including a meandering metallic trace. According to some examples, this may extend the product lifetime of the overall system.

Additionally, according to some examples, systems using the optical interconnect(s) may have one-to-many signaling (e.g., one optical transmitter to multiple optical receivers or one optical receiver to multiple optical transmitters) and many-to-one signaling (e.g., multiple optical transmitters to one optical receiver or multiple optical receivers to one optical transmitter) among individual electronic components. According to some examples, the signal pathways in the system are not limited to a pre-ordained physical configuration of wired connectivity as is present in systems using meandering metallic traces between electronic components.

Additionally, according to some examples, the ability of a single optical interconnect to support multiple wavelengths may allow the system to support higher bandwidths than a corresponding system having a meandering metallic trace. For example, optical interconnects may be used for higher-bandwidth applications if needed by using multiple LEDs or sources at different wavelengths. The configuration may be implemented by having multiple sources at a single point (e.g., a high-definition camera), or by single but different sources distributed among different points, and combined so the data may be carried on a single waveguide. In this manner the system may be narrow as compared to a corresponding system including a meandering metallic trace if the application requires, but may support large amounts of bandwidth.

Additionally, according to some examples of the system including a varying thickness of the encapsulant layer, the strain caused by stresses is imparted to the system in stretchable areas that are designed for it, while reducing strain in areas that are not desired to stretch. In contrast, systems with a substantially uniform thickness across an elastomer layer or other encapsulating layer do not concentrate strain in different areas. As a result, areas that were not designed to stretch may stretch and be damaged. Therefore the mechanical reliability and durability of systems having a varying thickness of an encapsulant layer are greatly improved by comparison. Specifically, by varying the thickness across the encapsulant layer, systems may show increased durability in cyclical stretching tests and in single stretching strength tests. For example, various embodiments of the system may show an increase in durability of approximately 3 to 10 times compared to a system that does not have a varying thickness.

Additionally, according to some examples of the system, the use of optical interconnects may negate the need for a signal to undergo voltage-level shifting between electrical components having different power-supply voltages. This is in contrast to systems that connect electrical components having different power-supply voltages with an electrical connection. The ability to forego voltage-level shifting, and be free of components for shifting voltage levels, by using optical interconnects may help to simplify the construction of the system. As an example, the system can be free of a voltage shifter component. Additionally, according to some examples, the ability of the system to forego voltage-level shifting may increase the modularity of the system, for example, because electronic components having different supply voltages may be substituted for each other and an optical signal may be transmitted between those components regardless of their respective supply voltages.

Additional Embodiments

The following exemplary embodiments are provided, the numbering of which is not to be construed as designating levels of importance.

Embodiment 1 provides a stretchable packaging system, comprising:
a first electronic component comprising a first optical emitter;
a second electronic component comprising a first receiver;
an optical interconnect comprising a first elastomer having a first refractive index and connecting the first optical emitter to the first receiver; and
an encapsulant layer comprising a second elastomer having a second refractive index and at least partially encapsulating the first electronic component, the second electronic component, and the optical interconnect.

Embodiment 2 provides the stretchable packaging system of Embodiment 1, wherein the first optical emitter is chosen from a light-emitting diode or a laser diode.

Embodiment 3 provides the stretchable packaging system of any one of Embodiments 1 or 2, wherein at least one of the first and second electronic components are chosen from a chip, a circuit board, a processor, and a memory.

Embodiment 4 provides the stretchable packaging system of any one of Embodiments 1-3, further comprising a modulator attached to the first optical emitter.

Embodiment 5 provides the stretchable packaging system of any one of Embodiments 1-4, wherein the first receiver is a photodiode receptor.

Embodiment 6 provides the stretchable packaging system of any one of Embodiments 1-5, wherein the first and second elastomers are chosen from a thermoplastic polyurethane, a butyl rubber, a poly-dimethyl siloxane, a latex, or mixtures thereof.

Embodiment 7 provides the stretchable packaging system of Embodiment 6, wherein at least one of the first elastomer and the second elastomer is waterproof.

Embodiment 8 provides the stretchable packaging system of Embodiment 6, wherein at least one of the first elastomer and the second elastomer is substantially water resistant.

Embodiment 9 provides the stretchable packaging system of any one of Embodiments 1-8, wherein a refractive index value of the first elastomer ranges from about 1.01 to about 2.0.

Embodiment 10 provides the stretchable packaging system of any one of Embodiments 1-9, wherein the first electronic component further comprises a second receiver, and the second electronic component further comprises a second optical emitter.

Embodiment 11 provides the stretchable packaging system of Embodiment 10, further comprising a second optical interconnect comprising a third elastomer connecting the second receiver and the second optical emitter.

Embodiment 12 provides the stretchable packaging system of Embodiment 11, wherein the third elastomer is different from the first elastomer.

Embodiment 13 provides the stretchable packaging system of Embodiment 11, wherein the third elastomer is the same as the first elastomer.

Embodiment 14 provides the stretchable packaging system of Embodiment 12, wherein the refractive index value of the first elastomer is different from a refractive index value of the third elastomer.

Embodiment 15 provides the stretchable packaging system of any one of Embodiments 12 or 13, wherein the refractive index value of the first elastomer is substantially the same as a refractive index value of the third elastomer.

Embodiment 16 provides the stretchable packaging system of any one of Embodiments 1-15, further comprising a first power source connected to the first electronic component.

Embodiment 17 provides the stretchable packaging system of Embodiment 16, further comprising a second power source connected to the second electronic component.

Embodiment 18 provides the stretchable packaging system of any one of Embodiments 16 or 17, wherein at least one of the first power source and the second power source is a battery.

Embodiment 19 provides the stretchable packaging system of any one of Embodiments 1-18, further comprising a metallic interconnect connecting the first electronic component and the second electronic component.

Embodiment 20 provides the stretchable packaging system of Embodiment 19, wherein the metallic interconnect has a generally serpentine shape.

Embodiment 21 provides the stretchable packaging system of any one of Embodiments 1-20, wherein the second electronic component further comprises a converter for converting an optical emission from the first optical emitter into electric power.

Embodiment 22 provides a textile comprising the stretchable packaging system of any one of Embodiments 1-21.

Embodiment 23 provides the textile of Embodiment 22, wherein the textile is incorporated into a garment.

Embodiment 24 provides the textile of Embodiment 23, wherein the stretchable packaging system is located at a seam of the garment.

Embodiment 25 provides the stretchable packaging system of any one of Embodiments 1-21, wherein a first region of the encapsulant layer at least partially encapsulates the first electronic component and has a first thickness that is greater than a second thickness of a second region of the encapsulant layer that at least partially encapsulates the optical interconnect, and a third region of the encapsulant layer that at least partially encapsulates the second electronic component has a third thickness that is greater than the second thickness.

Embodiment 26 provides the stretchable packaging system of Embodiment 25, wherein the first thickness ranges from about 1.5 to about 5 times greater than the second thickness.

Embodiment 27 provides the stretchable packaging system of any one of Embodiments 25 or 26, wherein the thickness of each of the first, second, or third regions is variable within the respective region.

Embodiment 28 provides the stretchable packaging system of any one of Embodiments 25-27, wherein the third thickness is greater than the first thickness.

Embodiment 29 provides the stretchable packaging system of any one of Embodiments 25-28, wherein the second region is more stretchable than the first region or the third region.

Embodiment 30 provides the stretchable packaging system of any one of Embodiments 25-27, wherein the third thickness is less than the first thickness.

Embodiment 31 provides the stretchable packaging system of any one of Embodiments 25-30, wherein the first region is configured to remain substantially stiff relative to the second region.

Embodiment 32 provides the stretchable packaging system of any one of Embodiments 1-21 or 25-31, wherein the system shows an increase in reliability in cyclical stretch testing compared to a system that includes a metal trace connecting the first electronic component and the second electronic component.

Embodiment 33 provides the stretchable packaging system of any one of Embodiments 1-21 or 25-32, wherein the system is free of a metal trace connecting the first electronic component and the second electronic component.

Embodiment 34 provides a system, comprising:
 a first electronic component comprising a first optical emitter;
 a second electronic component comprising a first receiver;
 an optical interconnect comprising a first elastomer having a first refractive index and connecting the first optical emitter to the first receiver; and
 an encapsulant layer comprising a second elastomer having a second refractive index and at least partially encapsulating the first electronic component, the second electronic component, and the optical interconnect,
 wherein the first and second elastomers are chosen from a thermoplastic polyurethane, a butyl rubber, a poly-dimethyl siloxane, a latex, or mixtures thereof.

Embodiment 35 provides the system of Embodiment 34, wherein the first optical emitter is chosen from a light-emitting diode or a laser diode.

Embodiment 36 provides the system of any one of Embodiments 34 or 35, wherein at least one of the first and second electronic components is chosen from a chip, a circuit board, a processor, and a memory.

Embodiment 37 provides the system of any one of Embodiments 34-36, further comprising a modulator attached to the first optical emitter.

Embodiment 38 provides the system of any one of Embodiments 34-37, wherein the first receiver is a photodiode receptor.

Embodiment 39 provides the system of any one of Embodiments 34-38, wherein at least one of the first elastomer and the second elastomer is waterproof.

Embodiment 40 provides the system of any one of Embodiments 34-38, wherein at least one of the first elastomer and the second elastomer is substantially water resistant.

Embodiment 41 provides the system of any one of Embodiments 34-40, wherein a refractive index value of the first elastomer ranges from about 1.01 to about 2.0.

Embodiment 42 provides the system of any one of Embodiments 34-41, wherein the first electronic component further comprises a second receiver, and the second electronic component further comprises a second optical emitter.

Embodiment 43 provides the system of Embodiment 42 further comprising a second optical interconnect comprising a third elastomer connecting the second receiver and the second optical emitter.

Embodiment 44 provides the system of Embodiment 43, wherein the third elastomer is different from the first elastomer.

Embodiment 45 provides the system of Embodiment 43, wherein the third elastomer is the same as the first elastomer.

Embodiment 46 provides the system of Embodiment 44, wherein the refractive index value of the first elastomer is different from a refractive index value of the third elastomer.

Embodiment 47 provides the system of any one of Embodiments 44 or 45, wherein the refractive index value of the first elastomer is substantially the same as a refractive index value of the third elastomer.

Embodiment 48 provides the system of any one of Embodiments 34-47, further comprising a first power source connected to the first electronic component.

Embodiment 49 provides the system of Embodiment 48, further comprising a second power source connected to the second electronic component.

Embodiment 50 provides the system of any one of Embodiments 48 or 49, wherein at least one of the first power source and the second power source is a battery.

Embodiment 51 provides the system of any one of Embodiments 34-50, further comprising a metallic interconnect connecting the first electronic component and the second electronic component.

Embodiment 52 provides the system of Embodiment 51, wherein the metallic interconnect has a generally serpentine shape.

Embodiment 53 provides the system of any one of Embodiments 34-52, wherein the second electronic component further comprises a converter for converting an optical emission from the first optical emitter into electric power.

Embodiment 54 provides the system of any one of Embodiments 34-53, wherein a first region of the encapsulant layer at least partially encapsulates the first electronic component and has a first thickness that is greater than a second thickness of a second region of the encapsulant layer that at least partially encapsulates the optical interconnect, and a third region of the encapsulant layer that at least partially encapsulates the second electronic component has a third thickness that is greater than the second thickness, Embodiment 55 provides the system of Embodiment 54, wherein the first thickness ranges from about 1.5 to about 5 times greater than the second thickness.

Embodiment 56 provides the system of any one of Embodiments 54 or 55, wherein the thickness of each of the first, second, or third regions is variable within the respective region.

Embodiment 57 provides the system of any one of Embodiments 54-56, wherein the third thickness is greater than the first thickness.

Embodiment 58 provides the system of any one of Embodiments 54-57, wherein the second region is more stretchable than the first region or the third region.

Embodiment 59 provides the system of any one of Embodiments 54-56, wherein the third thickness is less than the first thickness.

Embodiment 60 provides the system of any one of Embodiments 54-59, wherein the first region is configured to remain substantially stiff relative to the second region.

Embodiment 61 provides the system of any one of Embodiments 34-60, wherein the system shows an increase in reliability in cyclical stretch testing compared to a system that includes a metal trace connecting the first electronic component and the second electronic component.

Embodiment 62 provides the system of any one of Embodiments 34-61, wherein the system is free of a metal trace connecting the first electronic component and the second electronic component.

Embodiment 63 provides a method of making a stretchable packaging system, the method comprising:

disposing an optical interconnect comprising a first elastomer component between a first electronic component and a second electronic component;

connecting the optical interconnect to a first optical emitter of the first electronic component and to a first receiver of the second electronic component; and at least partially encapsulating the optical interconnect, first electronic component, and second electronic component with an encapsulant component comprising a second elastomer component.

Embodiment 64 provides the method of Embodiment 63, wherein disposing the optical interconnect comprises:

depositing a quantity of the first elastomer component between the first receiver and the first optical emitter; and irradiating the quantity of the first elastomer component to alter a refractive index value of the first elastomer component.

Embodiment 65 provides the method of Embodiment 64, wherein the first elastomer component is irradiated with at least one of an ultraviolet light and a laser.

Embodiment 66 provides the method of any one of Embodiments 64 or 65, further comprising disposing a mask on the first elastomer component.

Embodiment 67 provides the method of Embodiment 63, wherein disposing the optical interconnect comprises:

depositing a quantity of the first elastomer component between the first receiver and the first optical emitter; and embossing the quantity of the first elastomer component.

Embodiment 68 provides the method of Embodiment 63, wherein disposing the optical interconnect comprises:

using an additive manufacturing machine to deposit a quantity of the first elastomer component between the first receiver and the first optical emitter.

Embodiment 69 provides the method of Embodiment 63, wherein disposing the optical interconnect comprises etching the first elastomer component to form a waveguide.

Embodiment 70 provides the method of Embodiment 69, wherein the first elastomer component is etched with a laser.

What is claimed is:

1. A stretchable packaging system, comprising:
   a first electronic component comprising a first optical emitter;
   a second electronic component comprising a first receiver;
   an optical interconnect comprising a first elastomer having a first refractive index and connecting the first optical emitter to the first receiver; and
   an encapsulant layer comprising a second elastomer having a second refractive index and at least partially encapsulating the first electronic component, the second electronic component, and the optical interconnect, wherein a first region of the encapsulant layer at least partially encapsulates the first electronic component and has a first thickness that is greater than a second thickness of a second region of the encapsulant layer that at least partially encapsulates the optical interconnect, and a third region of the encapsulant layer that at least partially encapsulates the second electronic component has a third thickness that is greater than the second thickness.

2. The stretchable packaging system of claim 1, wherein the first optical emitter is chosen from a light-emitting diode or a laser diode.

3. The stretchable packaging system of claim 1, wherein at least one of the first and second electronic components are chosen from a chip, a circuit board, a processor, and a memory.

4. The stretchable packaging system of claim 1, wherein the first receiver is a photodiode receptor.

5. The stretchable packaging system of claim 1, wherein the first and second elastomers are chosen from a thermoplastic polyurethane, a butyl rubber, a poly-dimethyl siloxane, a latex, or mixtures thereof.

6. The stretchable packaging system of claim 1, wherein a refractive index value of the first elastomer ranges from about 1.01 to about 2.0.

7. The stretchable packaging system of claim 1, wherein the second electronic component further comprises a converter for converting an optical emission from the first optical emitter into electric power.

8. A system, comprising:
   a first electronic component comprising a first optical emitter;
   a second electronic component comprising a first receiver;
   an optical interconnect comprising a first elastomer having a first refractive index and connecting the first optical emitter to the first receiver; and
   an encapsulant layer comprising a second elastomer having a second refractive index and at least partially encapsulating the first electronic component, the second electronic component, and the optical interconnect, wherein the first and second elastomers are chosen from a thermoplastic polyurethane, a butyl rubber, a poly-dimethyl siloxane, a latex, or mixtures thereof and
   a first region of the encapsulant layer at least partially encapsulates the first electronic component and has a first thickness that is greater than a second thickness of a second region of the encapsulant layer that at least partially encapsulates the optical interconnect and a third region of the encapsulant layer that at least partially encapsulates the second electronic component has a third thickness that is greater than the second thickness.

9. The system of claim 8, wherein the first optical emitter is chosen from a light-emitting diode or a laser diode.

10. The system of claim 8, wherein at least one of the first and second electronic components is chosen from a chip, a circuit board, a processor, and a memory.

11. The system of claim 8, further comprising a modulator attached to the first optical emitter.

12. The system of claim 8, wherein the first receiver is a photodiode receptor.

13. The system of claim 8, wherein the second electronic component further comprises a converter for converting an optical emission from the first optical emitter into electric power.

14. A method of making a stretchable packaging system, the method comprising:
   disposing an optical interconnect comprising a first elastomer component between a first electronic component and a second electronic component;
   connecting the optical interconnect to a first optical emitter of the first electronic component and to a first receiver of the second electronic component; and
   at least partially encapsulating the optical interconnect, first electronic component, and second electronic component with an encapsulant layer comprising a second elastomer component,
   wherein a first region of the encapsulant layer at least partially encapsulates the first electronic component and has a first thickness that is greater than a second thickness of a second region of the encapsulant layer that at least partially encapsulates the optical interconnect and a third region of the encapsulant layer that at least partially encapsulates the second electronic component has a third thickness that is greater than the second thickness.

15. The method of claim 14, wherein disposing the optical interconnect comprises:
   depositing a quantity of the first elastomer component between the first receiver and the first optical emitter; and
   irradiating the quantity of the first elastomer component to alter a refractive index value of the first elastomer component.

16. The method of claim 15, wherein the first elastomer component is irradiated with at least one of an ultraviolet light and a laser.

17. The method of claim 14, further comprising disposing a mask on the first elastomer component.

18. The method of claim 14, wherein disposing the optical interconnect comprises:
   depositing a quantity of the first elastomer component between the first receiver and the first optical emitter; and
   embossing the quantity of the first elastomer component.

19. The method of claim 14, wherein disposing the optical interconnect comprises: using an additive manufacturing machine to deposit a quantity of the first elastomer component between the first receiver and the first optical emitter.

* * * * *

UNITED STATES PATENT AND TRADEMARK OFFICE
CERTIFICATE OF CORRECTION

| | | |
|---|---|---|
| PATENT NO. | : 10,353,146 B2 | Page 1 of 1 |
| APPLICATION NO. | : 15/635881 | |
| DATED | : July 16, 2019 | |
| INVENTOR(S) | : Aleksov et al. | |

It is certified that error appears in the above-identified patent and that said Letters Patent is hereby corrected as shown below:

On the Title Page

In item (57), in "Abstract", in Column 2, Line 8, delete "encapsulate" and insert --encapsulant-- therefor In the Claims In Column 14, Line 36, in Claim 8, after "interconnect", insert --,--

In Column 15, Lines 3-4, in Claim 14, after "interconnect", insert --,--

In Column 15, Line 28, in Claim 19, after "comprises:", insert --¶--

Signed and Sealed this
Second Day of February, 2021

Drew Hirshfeld
*Performing the Functions and Duties of the
Under Secretary of Commerce for Intellectual Property and
Director of the United States Patent and Trademark Office*